(12) United States Patent
Zhao et al.

(10) Patent No.: US 12,101,112 B1
(45) Date of Patent: Sep. 24, 2024

(54) OSCILLATOR FOR HIGH-SPEED SERIAL DEVICE

(71) Applicant: Marvell Asia Pte Ltd, Singapore (SG)

(72) Inventors: Hui Zhao, San Jose, CA (US); Fei Lu, San Jose, CA (US); Yuxiang Sun, San Jose, CA (US); Zhendong Guo, San Jose, CA (US); Banglong Qian, Shanghai (CN); Fang Lv, Shanghai (CN)

(73) Assignee: Marvell Asia Pte Ltd, Singapore (SG)

( * ) Notice: Subject to any disclaimer, the term of this patent is extended or adjusted under 35 U.S.C. 154(b) by 85 days.

(21) Appl. No.: 17/932,707

(22) Filed: Sep. 16, 2022

Related U.S. Application Data

(60) Provisional application No. 63/303,488, filed on Jan. 26, 2022, provisional application No. 63/246,709, filed on Sep. 21, 2021.

(51) Int. Cl.
*H04B 1/40* (2015.01)
*H03B 7/06* (2006.01)

(52) U.S. Cl.
CPC .................. *H04B 1/40* (2013.01); *H03B 7/06* (2013.01); *H03B 2200/0058* (2013.01)

(58) Field of Classification Search
CPC ... H04B 1/40; H04B 1/04; H04B 1/16; H04B 1/0475; H04B 1/10; H03B 7/06; H03B 2200/0058; H03B 1/00; H03B 2201/0208
See application file for complete search history.

(56) References Cited

U.S. PATENT DOCUMENTS

| | | | | |
|---|---|---|---|---|
| 5,959,515 A * | 9/1999 | Cornett | ...................... | H03J 3/20 |
| | | | | 257/E21.022 |
| 6,775,901 B1 * | 8/2004 | Lee | ...................... | H01L 23/645 |
| | | | | 366/200 |
| 7,616,065 B2 * | 11/2009 | Fernandez | .............. | H03L 7/085 |
| | | | | 331/25 |
| 8,742,859 B2 * | 6/2014 | Jin | ....................... | H03B 5/1268 |
| | | | | 336/200 |
| 8,842,410 B2 * | 9/2014 | Chan | ....................... | H01F 21/12 |
| | | | | 307/37 |
| 9,697,938 B2 | 7/2017 | Yan et al. | | |
| 9,781,254 B1 * | 10/2017 | Anim-Appiah | .......... | H04B 3/32 |
| 10,749,468 B1 * | 8/2020 | Park | ....................... | H03L 7/093 |
| 10,892,087 B1 | 1/2021 | She et al. | | |

(Continued)

*Primary Examiner* — Sophia Vlahos

(57) ABSTRACT

Transceiver circuitry for coupling a functional circuit to a transmission medium includes a transmit path for coupling between the functional circuit and the transmission medium, a receive path for coupling between the transmission medium and the functional circuit, and clock generation circuitry coupled to at least one of the transmit path and the receive path. The clock generation circuitry includes an oscillator having transconductance circuitry, a capacitance element coupled in parallel with the transconductance circuitry, a plurality of inductors coupled in parallel with the transconductance circuitry and the capacitance element, and with each other, and a current source coupled to the plurality of inductors. The capacitance element may be variable. An even number of inductors are arranged so that half of the inductors generate magnetic flux in a first direction, and half of the inductors generate magnetic flux in a second direction opposite to the first direction.

24 Claims, 10 Drawing Sheets

(56) References Cited

U.S. PATENT DOCUMENTS

| | | | |
|---|---|---|---|
| 2011/0267522 A1* | 11/2011 | Gendai | H04N 23/54 |
| | | | 348/308 |
| 2011/0298503 A1* | 12/2011 | Obkircher | H03L 7/099 |
| | | | 327/147 |
| 2012/0286889 A1* | 11/2012 | Park | H03B 5/1268 |
| | | | 331/117 FE |
| 2015/0372643 A1* | 12/2015 | Ashckenazi | H03B 5/1243 |
| | | | 455/90.2 |
| 2016/0099678 A1* | 4/2016 | Kong | H03C 3/0925 |
| | | | 331/117 R |
| 2016/0118991 A1* | 4/2016 | Huang | H03B 5/1215 |
| | | | 331/18 |
| 2017/0085270 A1* | 3/2017 | Suzuki | H03B 5/32 |
| 2022/0011810 A1* | 1/2022 | Huang | H03B 5/1265 |

\* cited by examiner

OSCILLATOR FOR HIGH-SPEED SERIAL DEVICE

CROSS REFERENCE TO RELATED APPLICATIONS

This disclosure claims the benefit of commonly-assigned United States Provisional Patent Application No. 63/246,709, filed Sep. 21, 2021, which is hereby incorporated by reference herein in its entirety, and the benefit of commonly-assigned United States Provisional Patent Application No. 63/303,488, filed Jan. 26, 2022.

FIELD OF USE

This disclosure relates to oscillators for use in high-speed data channels. More particularly, this disclosure relates to an oscillator for an integrated circuit serializer-deserializer (SERDES), having an improved quality factor and reduced injection pulling.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

SERDES circuits in integrated circuit devices, such as in high-speed transceiver circuits, incorporate oscillator circuits. Frequently the oscillator circuits are differential L-C oscillator circuits, and differential L-C oscillator circuits may be one of the only practical alternatives when high data rates (e.g., 30 Gbps and higher) are involved. It can be difficult to provide inductors with good quality factors ("Q-factors"), which affects oscillator performance characteristics, such as jitter. A differential L-C oscillator also may be susceptible to injection pulling from devices such as power amplifiers, or from other oscillators in close proximity, which may pull the frequency of the differential L-C oscillator toward the frequency of the other oscillator. Moreover, as data rates increase, the size of the inductors used in a differential L-C oscillator circuit decreases, degrading the Q-factors of the inductors, which degrades performance (e.g., increases jitter) and also makes the oscillator more susceptible to injection pulling.

SUMMARY

In accordance with implementations of the subject matter of this disclosure, transceiver circuitry configured to couple a functional circuit to a transmission medium includes a transmit path configured for coupling between the functional circuit and the transmission medium, a receive path configured for coupling between the transmission medium and the functional circuit, and clock generation circuitry coupled to at least one of the transmit path and the receive path. The clock generation circuitry includes an oscillator having transconductance circuitry, a capacitance element coupled in parallel with the transconductance circuitry, a plurality of inductors coupled in parallel with the transconductance circuitry and the capacitance element, and with each other, and a current source coupled to the plurality of inductors.

In a first implementation of such transceiver circuitry, the capacitance element may be variable, for tuning a frequency of the oscillator.

According to a first aspect of that first implementation, the variable capacitance element may include a variable capacitor.

In a first instance of that first aspect, the variable capacitor may include a varactor, whose capacitance is a function of the voltage applied across the varactor.

According to a second aspect of that first implementation, the variable capacitance element may include a plurality of capacitors, and each capacitor in the plurality of capacitors is switchably coupled in parallel with each other capacitor in the plurality of capacitors.

In a second implementation of such transceiver circuitry, the current source may include a transistor in a source-follower configuration.

In a third implementation of such transceiver circuitry, the current source may include a plurality of current sources, each respective current source in the plurality of current sources being coupled to a respective inductor in the plurality of inductors.

According to first aspect of that third implementation, each respective current source may be separately controllable.

In a fourth implementation of such transceiver circuitry, the plurality of inductors may include an even number of inductors arranged so that a first half of the even number of inductors generates a first magnetic flux in a first direction, and a second half of the even number of inductors generates a second magnetic flux in a second direction opposite to the first direction, to mitigate injection pulling on a neighboring oscillator.

According to a first aspect of that fourth implementation, the inductors in the plurality of inductors may be arranged along a single axis.

According to a second aspect of that fourth implementation, the inductors in the plurality of inductors may be arranged along multiple axes.

In a fifth implementation of such transceiver circuitry, each inductor in the plurality of inductors may include a single loop.

In a sixth implementation of such transceiver circuitry, each inductor in the plurality of inductors may be a spiral inductor including a plurality of loops.

In accordance with implementations of the subject matter of this disclosure, a method of fabricating integrated circuit transceiver circuitry, configured to couple a functional circuit to a transmission medium, includes forming a transmit path configured for coupling between the functional circuit and the transmission medium, forming a receive path configured for coupling between the transmission medium and the functional circuit, and forming clock generation circuitry coupled to at least one of the transmit path and the receive path. Forming the clock generation circuitry includes forming an oscillator by forming transconductance circuitry, forming a capacitance coupled in parallel with the transconductance circuitry, forming a plurality of inductors coupled in parallel with the transconductance circuitry and the capacitance, and with each other, and forming a current source coupled to the plurality of inductors.

In a first implementation of such a method, forming the capacitance may include forming a variable capacitance, for tuning a frequency of the oscillator.

According to a first aspect of that first implementation, forming the variable capacitance may include forming a variable capacitor.

According to a first instance of that first aspect, forming the variable capacitor may include forming a varactor, whose capacitance is a function of the voltage applied across the varactor.

According to a second aspect of that first implementation, forming the variable capacitance may include forming a plurality of capacitors, each capacitor in the plurality of capacitors being switchably coupled in parallel with each other capacitor in the plurality of capacitors.

In a second implementation of such a method, forming the current source may include forming a transistor in a source-follower configuration.

In a third implementation of such a method, forming the current source may include forming a plurality of current sources, each respective current source in the plurality of current sources being coupled to a respective inductor in the plurality of inductors.

According to a first aspect of that third implementation, forming the plurality of current sources may include forming each respective current source to be separately controllable.

In a fourth implementation of such a method, forming the plurality of inductors may include forming an even number of inductors arranged so that a first half of the even number of inductors generates a first magnetic flux in a first direction, and a second half of the even number of inductors generates a second magnetic flux in a second direction opposite to the first direction, to mitigate injection pulling on a neighboring oscillator.

A first aspect of that fourth implementation, may include arranging the inductors in the plurality of inductors along a single axis.

A second aspect of that fourth implementation may include arranging the inductors in the plurality of inductors along multiple axes.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, SERDES circuits in integrated circuit devices, such as in high-speed transceiver circuits, incorporate oscillator circuits. Frequently the oscillator circuits are differential L-C oscillator circuits, and differential L-C oscillator circuits may be one of the only practical alternatives when high data rates (e.g., 30 Gbps and higher) are involved. It can be difficult to provide inductors with good quality factors ("Q-factors"), which affects performance characteristics of the differential L-C oscillator, such as jitter. The differential L-C oscillator also may be susceptible to injection pulling from devices such as power amplifiers, or from other oscillators in close proximity, which may pull the frequency of the differential L-C oscillator toward the frequency of the other oscillator. Moreover, as data rates increase, the size of the inductors used in a differential L-C oscillator circuit decreases, degrading the Q-factors of the inductors, which degrades performance (e.g., increases jitter) and also makes the oscillator more susceptible to injection pulling.

Therefore, in accordance with implementations of the subject matter of this disclosure, differential L-C oscillator performance in an integrated-circuit SERDES is improved by using multiple parallel inductors to achieve a desired inductance, as described in more detail below. Use of multiple parallel inductors improves the Q-factor by achieving lower inductance without requiring smaller inductors which would reduce the Q-factor.

In addition, also as described in more detail below, the multiple parallel inductors may be arranged to mitigate injection pulling—i.e., both to reduce the susceptibility of an oscillator to injection pulling from another source, and the reduce the injection pulling effect of the oscillator on a neighboring oscillator (or other device).

The subject matter of this disclosure may be better understood by reference to FIGS. 1-11.

Figure 1:
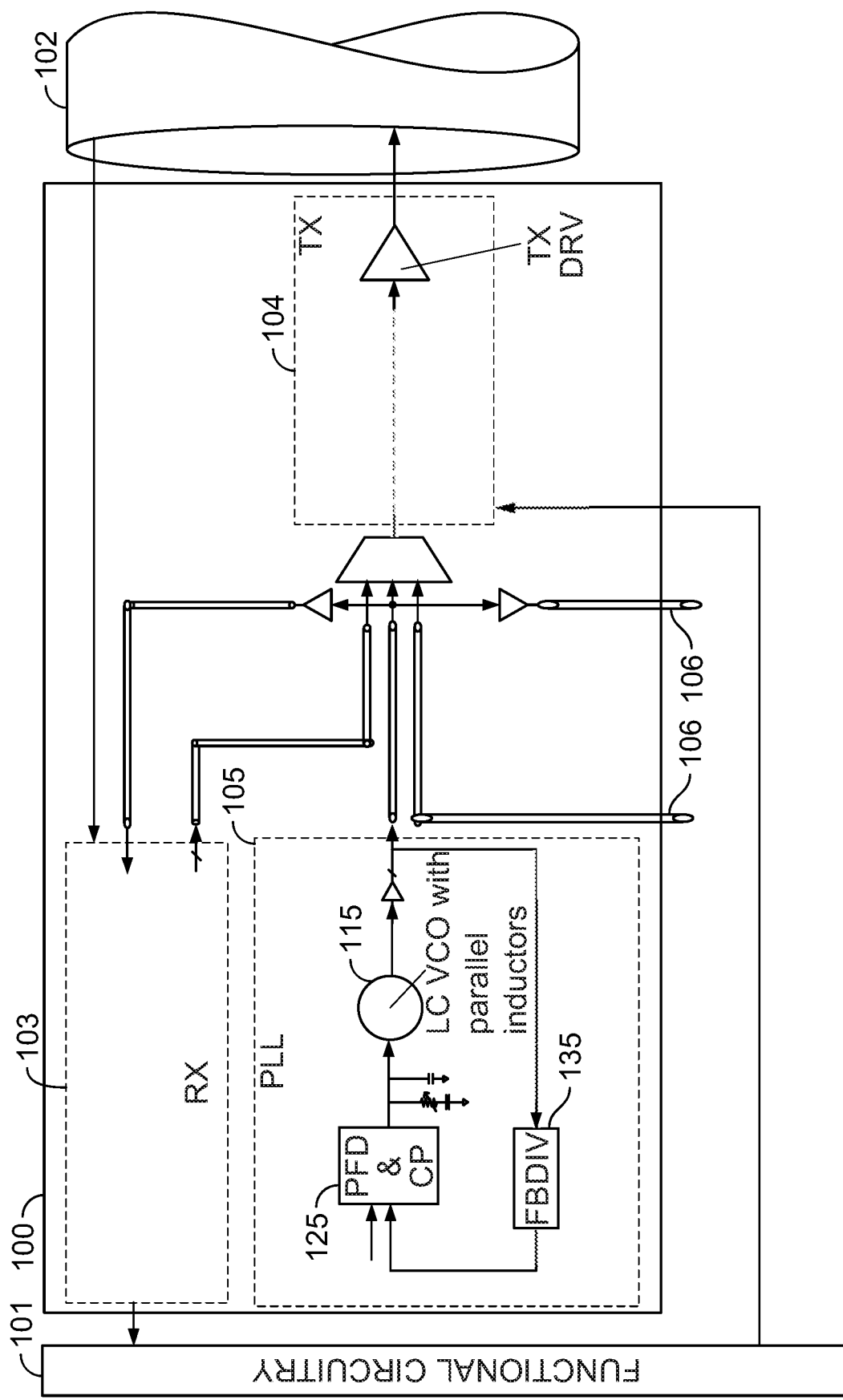
FIG. 1 is a block diagram of SERDES circuitry that may be used in a transceiver channel in accordance with implementations of the subject matter of this disclosure.

FIG. 1 is a block diagram of SERDES circuitry 100 that may be used in a transceiver channel in accordance with implementations of the subject matter of this disclosure to couple functional circuitry 101 to a transmission medium 102 (e.g., without limitation, any form of cable suitable for high-speed transmission). In this implementation, SERDES 100 may include a receive (RX) path 103 that deserializes data from transmission medium 102 for delivery to functional circuitry 101, and a transmit (TX) path 104 that serializes data output by functional circuitry 101 for propagation onto transmission medium 102. SERDES 100 also includes clock circuitry 105 for clocking various functions of receive (RX) path 103 and transmit (TX) path 104, including, but not limited to, the serialization and deserialization functions. Clock circuitry 105 may be phase-locked loop (PLL) circuitry, including L-C voltage-controlled oscillator (LC VCO) 115 having multiple parallel oscillators in accordance with implementations of the subject matter of this disclosure. PLL 105 may also include, as is typical, a phase-frequency detector and charge pump (shown together at 125) and a feedback divider (FBDIV) 135.

SERDES 100 may be one of a plurality of separate SERDES serving separate lanes of a multi-lane transceiver, and as shown, includes connections 106 for coupling to adjacent lanes.

Figure 2:
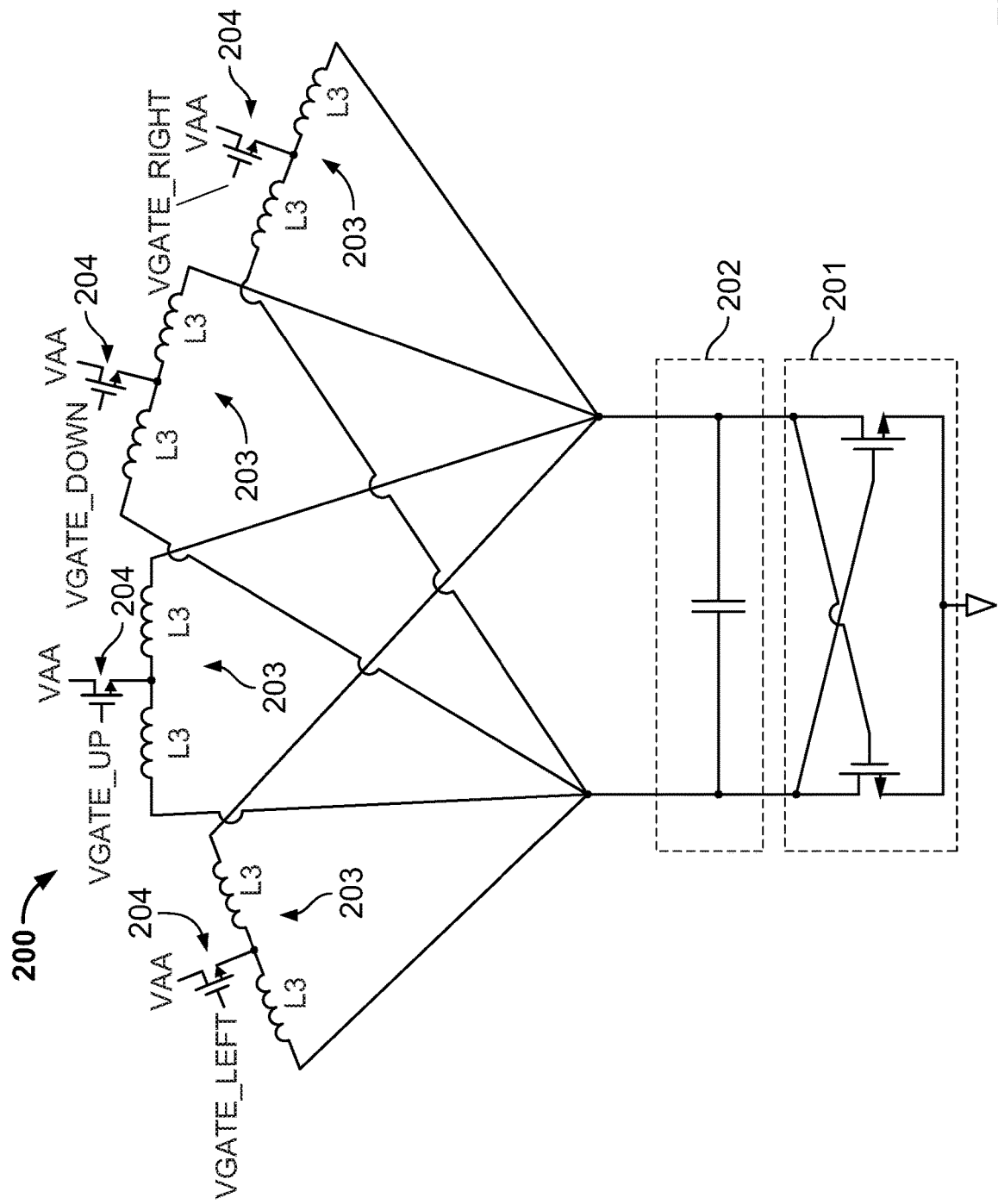
FIG. 2 is a diagram of a differential L-C oscillator in accordance with implementations of the subject matter of this disclosure.

In accordance with implementations of the subject matter of this disclosure, LC VCO 115 may be a differential L-C oscillator 200 as shown in FIG. 2. In this implementation, differential L-C oscillator 200 includes a cross-coupled NMOS transconductance ($g_m$) cell 201, a capacitance element 202, a plurality of parallel inductors 203, and one or more current sources 204. As is typical in oscillator circuits, transconductance cell 201 injects energy into the system, effectively serving as a "negative resistance" to prevent the oscillation from decaying over time.

As shown in FIG. 2, the plurality of parallel inductors 203 includes four parallel inductors, but the specific number of parallel inductors 203 may be any number as small as two, depending on the target inductance of a particular implementation.

Using multiple inductors in parallel can achieve reduced inductance without using smaller inductors. Specifically, the combined or total inductance $L_T$ of N parallel inductors is:

$$L_T = \frac{1}{\sum_{n=1}^{N} 1/L_n}$$

(which, when all La are the same, reduces to $L_T=L_n/N$). Because decreasing the size of an inductor decreases the Q-factor of that inductor, using multiple inductors in parallel instead of a single smaller inductor achieves a smaller inductance without decreasing the Q-factor.

Although transconductance cell 201 is shown as an NMOS transconductance cell, a PMOS transconductance cell or a CMOS transconductance cell (using both NMOS and PMOS devices) may be used instead (not shown).

Although differential L-C oscillator 200 may be fabricated with a single fixed capacitance element 202, which, when combined with a particular arrangement of parallel inductors 203, would provide a single output frequency, implementations of the subject matter of this disclosure include a variable capacitance element, allowing the output frequency to be tuned.

Figure 3:
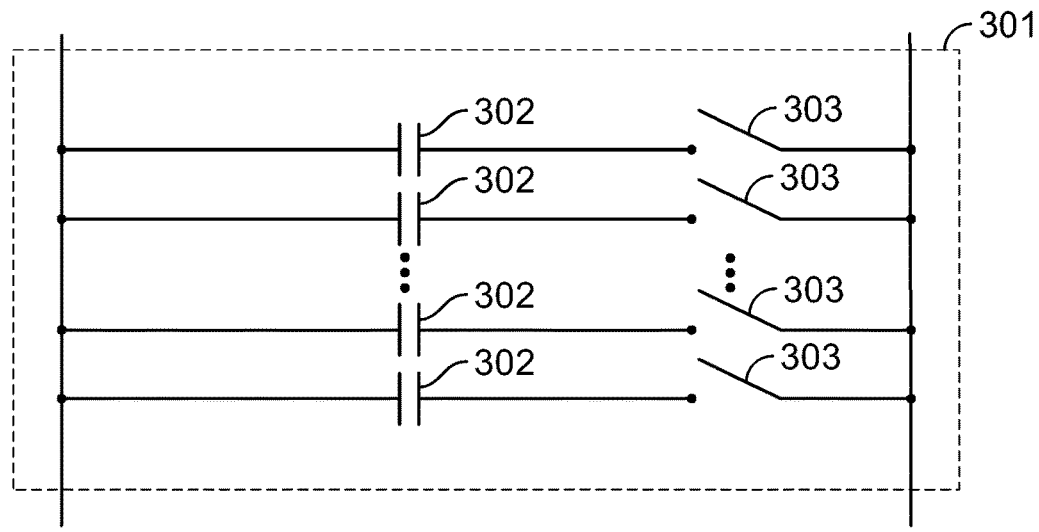
FIG. 3 is a diagram of a capacitor bank in accordance with implementations of the subject matter of this disclosure.
Figure 4:
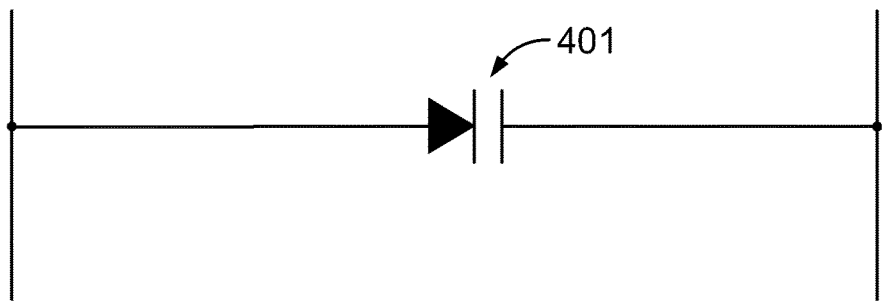
FIG. 4 shows a variable capacitor in accordance with implementations of the subject matter of this disclosure.

In one such implementation 300 shown in FIG. 3, capacitance element 202 may be a bank 301 of individual capacitors 302 which may be individually switched in using switches 303. In another such implementation 400 shown in FIG. 4, capacitance element 202 may be a variable capacitor, such as a varactor 401 whose capacitance is a function of the voltage applied across the varactor 401.

Current sources 204 provide power to the L-C oscillator 200. While any suitable type of current source may be used, a transistor arranged in a source-follower configuration as shown may be used in implementations of the subject matter of this disclosure. In some implementations, as shown, each current source 204 is coupled to a center tap of each inductor 203. By activating one, or all, or only some, of current sources 204, the bias current of L-C oscillator 200 may be controlled, which may be used to select, e.g., the amplitude of the oscillator output.

While FIG. 2 shows the electrical arrangement of the components of L-C oscillator 200, the actual layout of those components, and particularly of the inductors 203, may be selected to mitigate injection pulling—both to reduce the effect of L-C oscillator 200 as an aggressor, and to reduce the effect on L-C oscillator 200 as a victim, as shown in connection with FIGS. 5-10.

Figure 5:
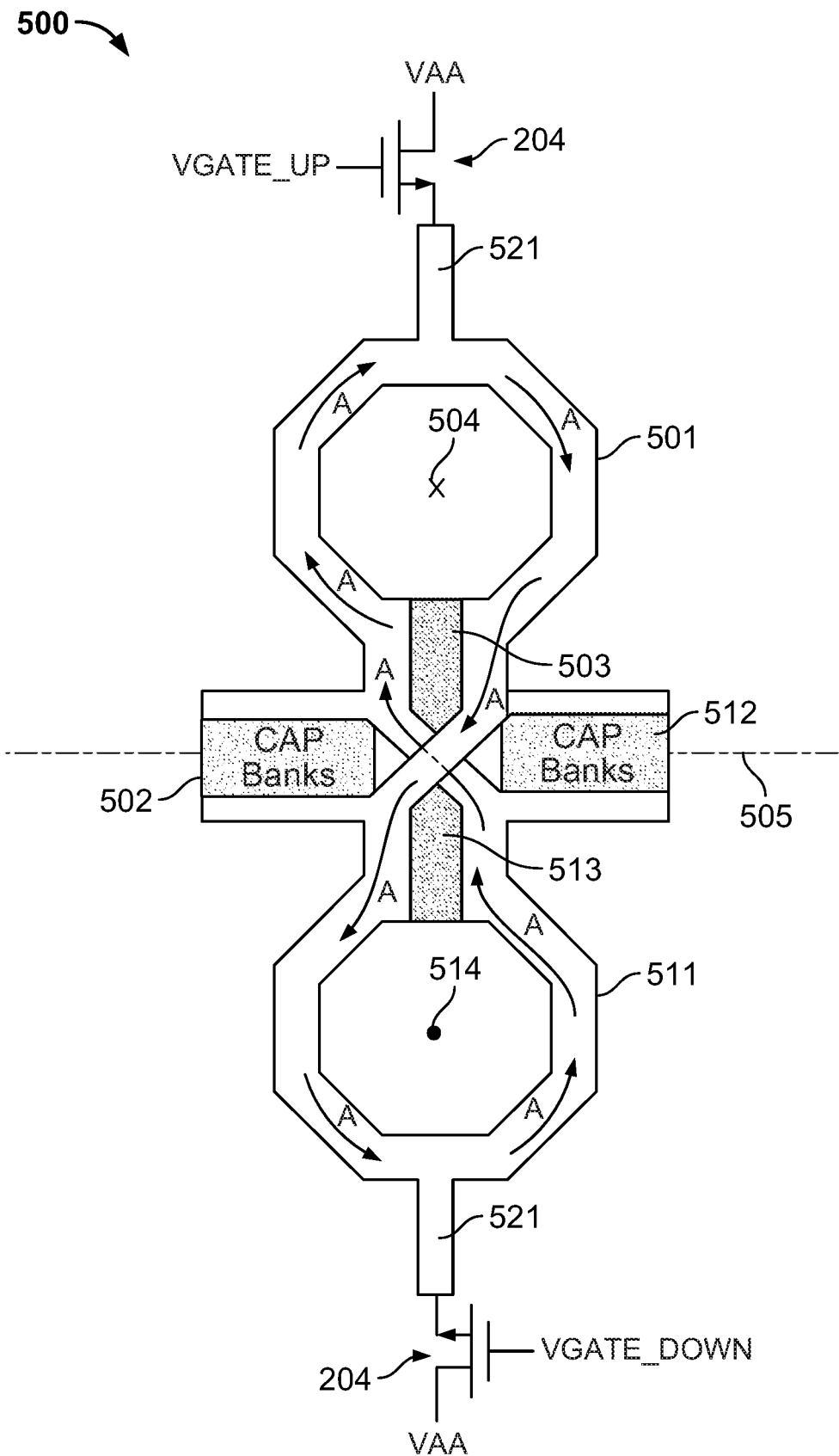
FIG. 5 shows a first layout of an L-C oscillator in accordance with implementations of the subject matter of this disclosure.

FIG. 5 shows a first layout 500 of an L-C oscillator 200 in accordance with implementations of the subject matter of this disclosure. In oscillator layout 500, each inductor 203 is instantiated as a single-loop inductor 501, 511. Although each loop 501, 511 is shown as a an octagon, each loop 501, 511 may be of any suitable shape, including, for example and without limitation, circular, hexagonal, etc. In this implementation, capacitance element 202 is implemented as capacitor banks 502, 512, which may, for example, be similar to capacitor bank 301 of FIG. 3. Transconductance cell 201 may be located at 503, 513. Each current source 204 is coupled to respective center tap 521 of respective loop 501, 511.

Figure 8:
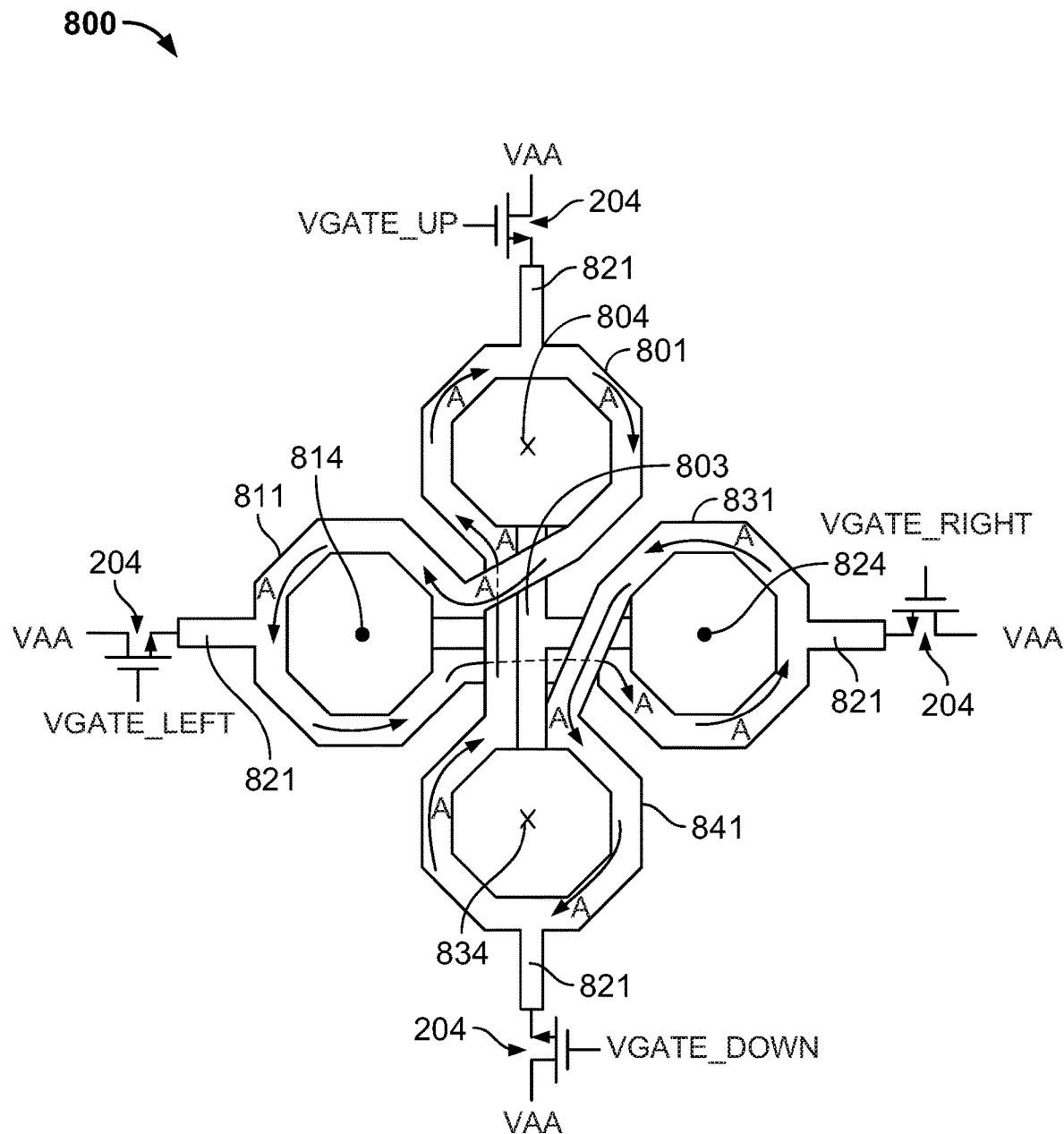
FIG. 8 shows a fourth layout of an L-C oscillator in accordance with implementations of the subject matter of this disclosure.

Inductors 501, 511 are coupled in a "figure-8" layout in which current may flow as indicated by the arrows A. Therefore, following the right-hand rule, magnetic flux in inductor 501 will flow into the plane of FIG. 5 as indicated by "X" 504, while magnetic flux in inductor 511 will flow out of the plane of FIG. 5 as indicated by the dot 514 (current also may flow in the direction opposite arrows A, in which case the direction of each of the two flux vectors 504, 514 will be reversed). If both inductors 501, 511 have the same inductance, the two flux vectors 504, 514 will cancel out outside of oscillator 500, mitigating the injection pulling effect of oscillator 500 as an aggressor. For oscillator 500 as a victim of injection pulling, such effects may be mitigated at least with respect to aggressors on or near axis 505, which would be equidistant or nearly equidistant from each flux vector 504, 514. Although this implementation shows two inductors providing opposing flux vectors that cancel out, any even number of inductors may provide opposing flux vectors that cancel out, as shown in implementations that follow.

Figure 6:
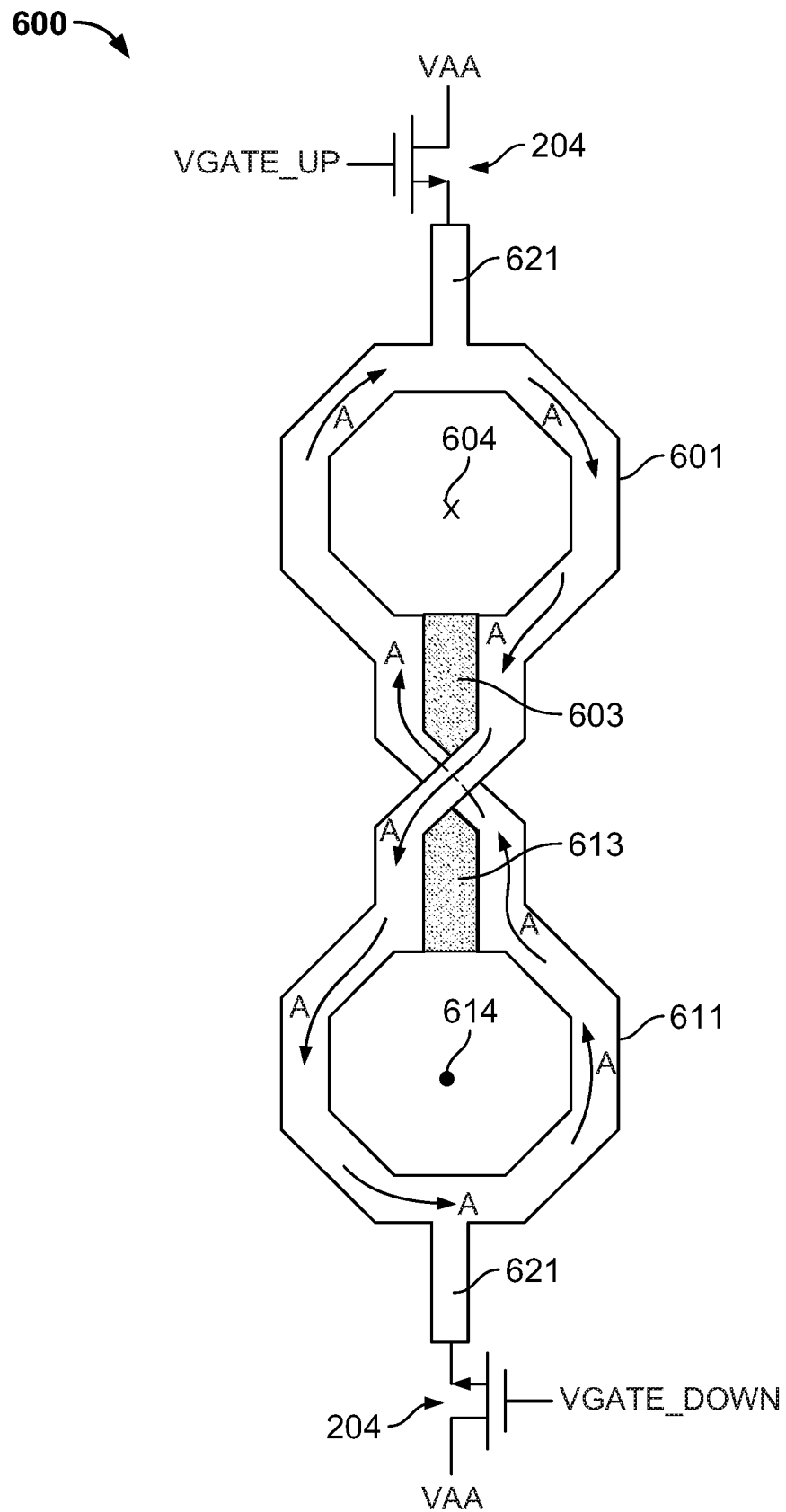
FIG. 6 shows a second layout of an L-C oscillator in accordance with implementations of the subject matter of this disclosure.

Oscillator layout 600 of FIG. 6 is substantially similar to oscillator layout 500 of FIG. 5, with inductor loops 601, 611 arranged similarly to loops 501, 511, giving rise to oppositely directed magnetic flux vectors 604, 614, similar to flux vectors 504, 514. However, rather than being separately located in areas 502, 512 and 503, 513, capacitance element 202 and transconductance cell 201 are both located in areas 603, 613 (similarly located to areas 503, 513 of layout 500). Although in the additional layouts described below, capacitance element 202 and transconductance cell 201 are shown as being separately located as in layout 500, they also may be co-located as in layout 600. Each current source 204 is coupled to respective center tap 621 of respective loop 601, 611.

Figure 7:
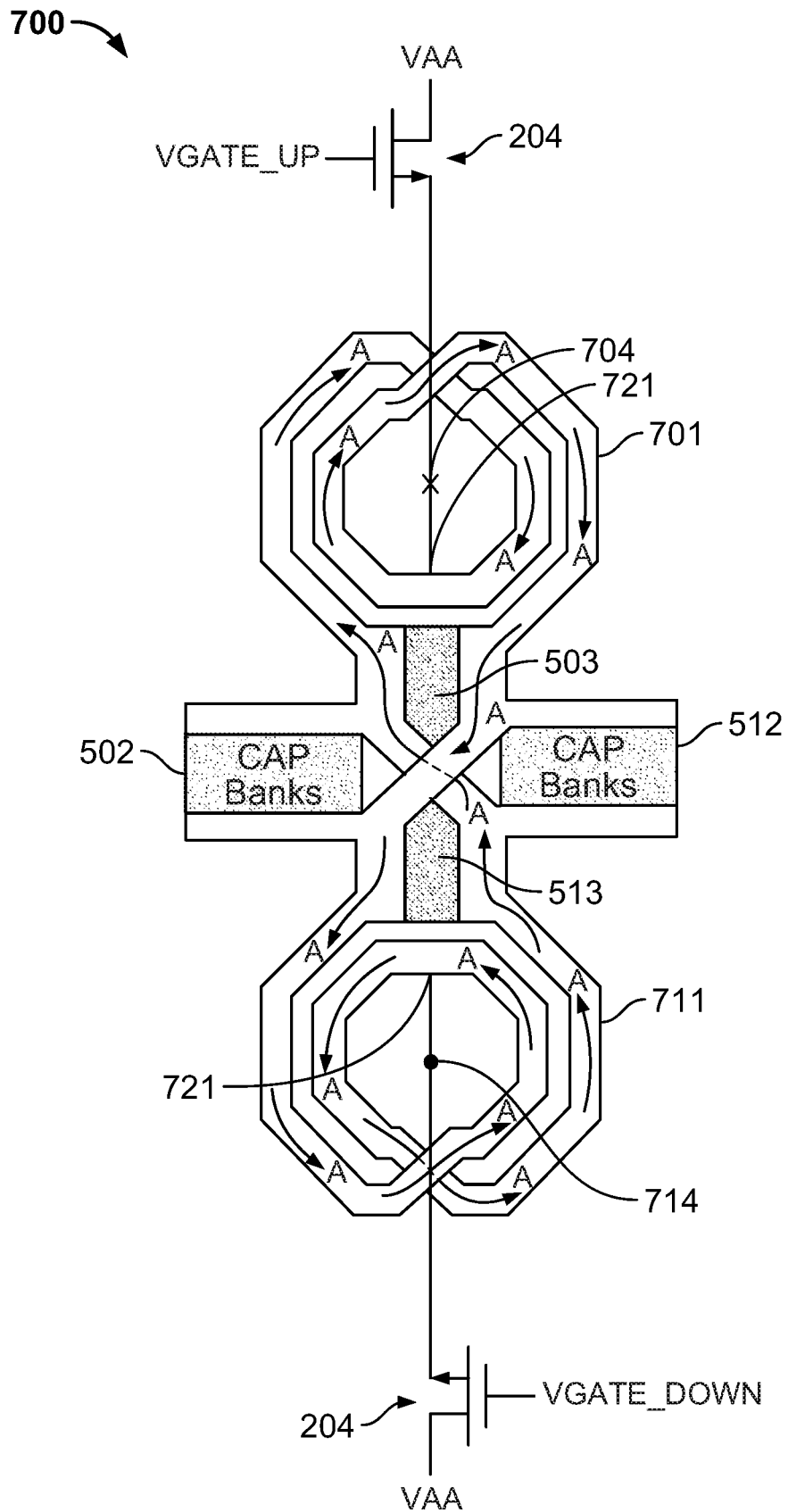
FIG. 7 shows a third layout of an L-C oscillator in accordance with implementations of the subject matter of this disclosure.

Oscillator layout 700 of FIG. 7 is substantially similar to oscillator layout 500 of FIG. 5, except that each inductor 701, 711 is a multi-loop, or "spiral," inductor, providing greater inductance without substantially increasing the device area consumed. Although each multi-loop inductor 701, 711 is shown with two loops, they may be implemented with any suitable number of loops. Resulting oppositely directed magnetic flux vectors 704, 714, will be similar to flux vectors 504, 514, but will have greater magnitudes because of the larger inductance of each loop 701, 711.

FIG. 8 shows a fourth layout 800 of an L-C oscillator 200 in accordance with implementations of the subject matter of this disclosure. Oscillator layout 800 differs from oscillator layouts 500, 600, 700 in that instead of two inductors along a single axis, oscillator layout 800 includes four inductors 801, 811, 821, 831, with two inductors 801, 821 arranged along a first axis, and two inductors 811, 831 arranged along a second axis orthogonal to the first axis. As in layouts 500, 600, each inductor is instantiated as an octagonal single-loop inductor, but also could be instantiated as a multi-loop inductor as in layout 700, and may be of any suitable shape, including, for example and without limitation, circular, hexagonal, etc., as described above. In this implementation, transconductance cell 201 and capacitance element 202 may be implemented anywhere in central area 803. Each current source 204 is coupled to respective center tap 821 of respective loop 801, 811, 831, 841.

Inductors 801, 811, 831, 841 are coupled in a continuous "butterfly" layout in which current may flow as indicated by the arrows A. Therefore, following the right-hand rule, magnetic flux in inductors 801, 841 will flow into the plane of FIG. 8, each as indicated by an "X" 804, while magnetic flux in inductors 811, 831 will flow out of the plane of FIG. 8, each as indicated by a dot 814 (current also may flow in the direction opposite arrows A, in which case the direction of each of the four flux vectors 804, 814 will be reversed). If all inductors 801, 811, 831, 841 have the same inductance, the two pairs of flux vectors 804, 814 will cancel out outside of oscillator 800, mitigating the injection pulling effect of oscillator 800 as an aggressor.

For oscillator 800 as a victim of injection pulling, because of the compact arrangement of inductors 801, 811, 831, 841 along two orthogonal axes, the victim effects may be mitigated with respect to aggressors in most locations, because any aggressor would be at substantially balanced distances from the two flux vectors 804 and the two flux vectors 814.

Figure 9:
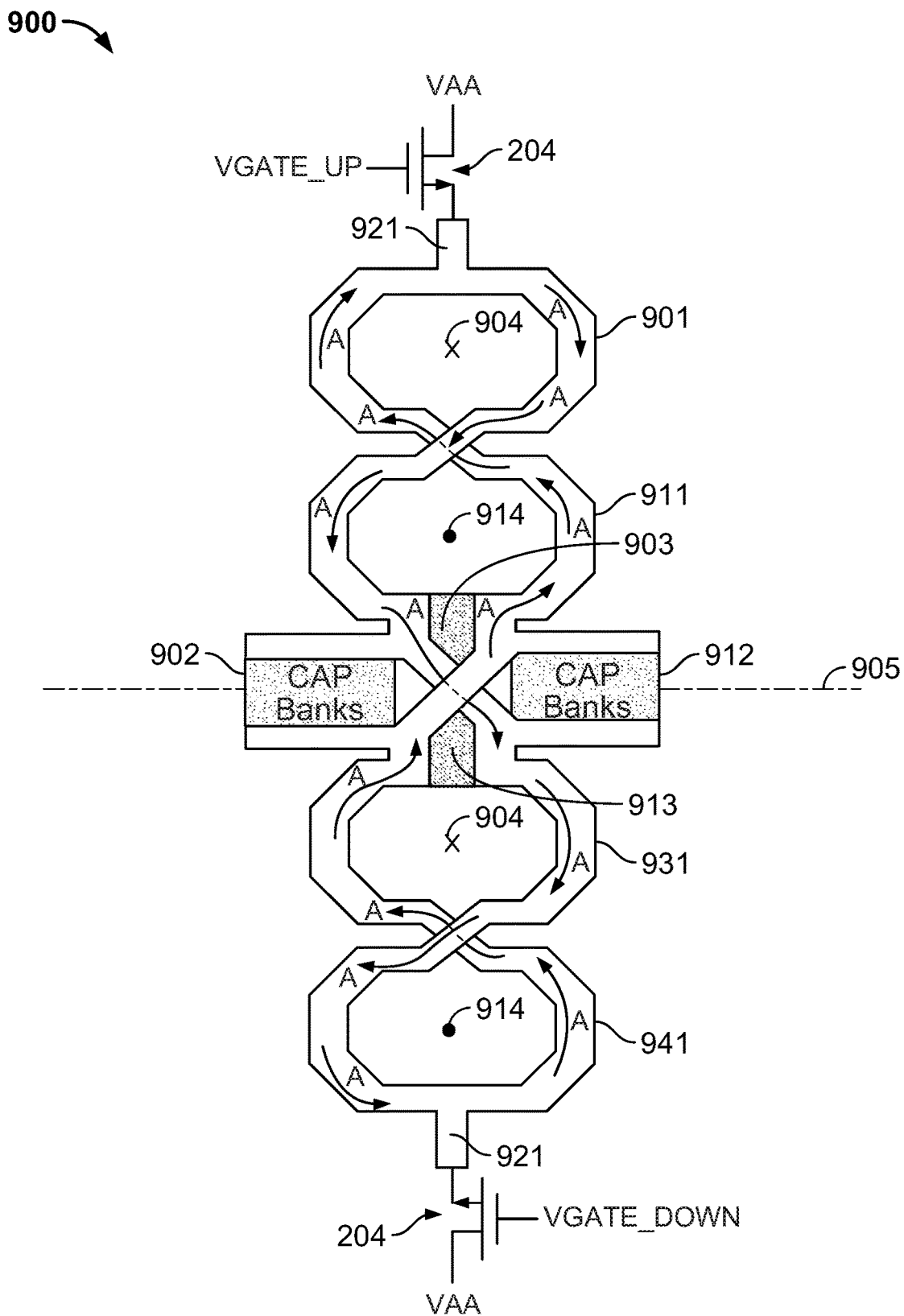
FIG. 9 shows a fifth layout of an L-C oscillator in accordance with implementations of the subject matter of this disclosure.

Oscillator layout 900 of FIG. 9 is similar to layouts 500, 600, 700 in that inductors 901, 911, 931, 941 are arranged linearly—i.e., along a single axis, but two inductors 901, 911 and 931, 941 are located on either side of central transconductance and capacitance regions 903, 913, 902, 912. As above, each inductor is instantiated as an octagonal single-loop inductor, but also could be instantiated as a multi-loop inductor as in layout 700, and may be of any suitable shape, including, for example and without limitation, circular, hexagonal, etc., as described above. Inductors 901, 911, 931, 941 are coupled in a "dual figure-8" layout in which current may flow as indicated by the arrows A. Therefore, following the right-hand rule, magnetic flux in inductors 901, 931 will flow into the plane of FIG. 9 as indicated by a respective "X" 904, while magnetic flux in inductors 911, 941 will flow out of the plane of FIG. 9 as indicated by a respective dot 914 (current also may flow in the direction opposite arrows A, in which case the direction of each of the flux vectors 904, 914 will be reversed). If all inductors 901, 911, 931, 941 have the same inductance, the two pairs of flux vectors 904, 914 will cancel out outside of oscillator 900, mitigating the injection pulling effect of oscillator 900 as an aggressor.

For oscillator 900 as a victim of injection pulling, the effects may be mitigated at least with respect to aggressors on or near axis 905, which would be equidistant or nearly equidistant from each pair of flux vectors 904, 914. For aggressors off axis 905, the larger distribution of flux vectors 904, 914 may at least partially mitigate injection pulling on oscillator 900.

Figure 10:
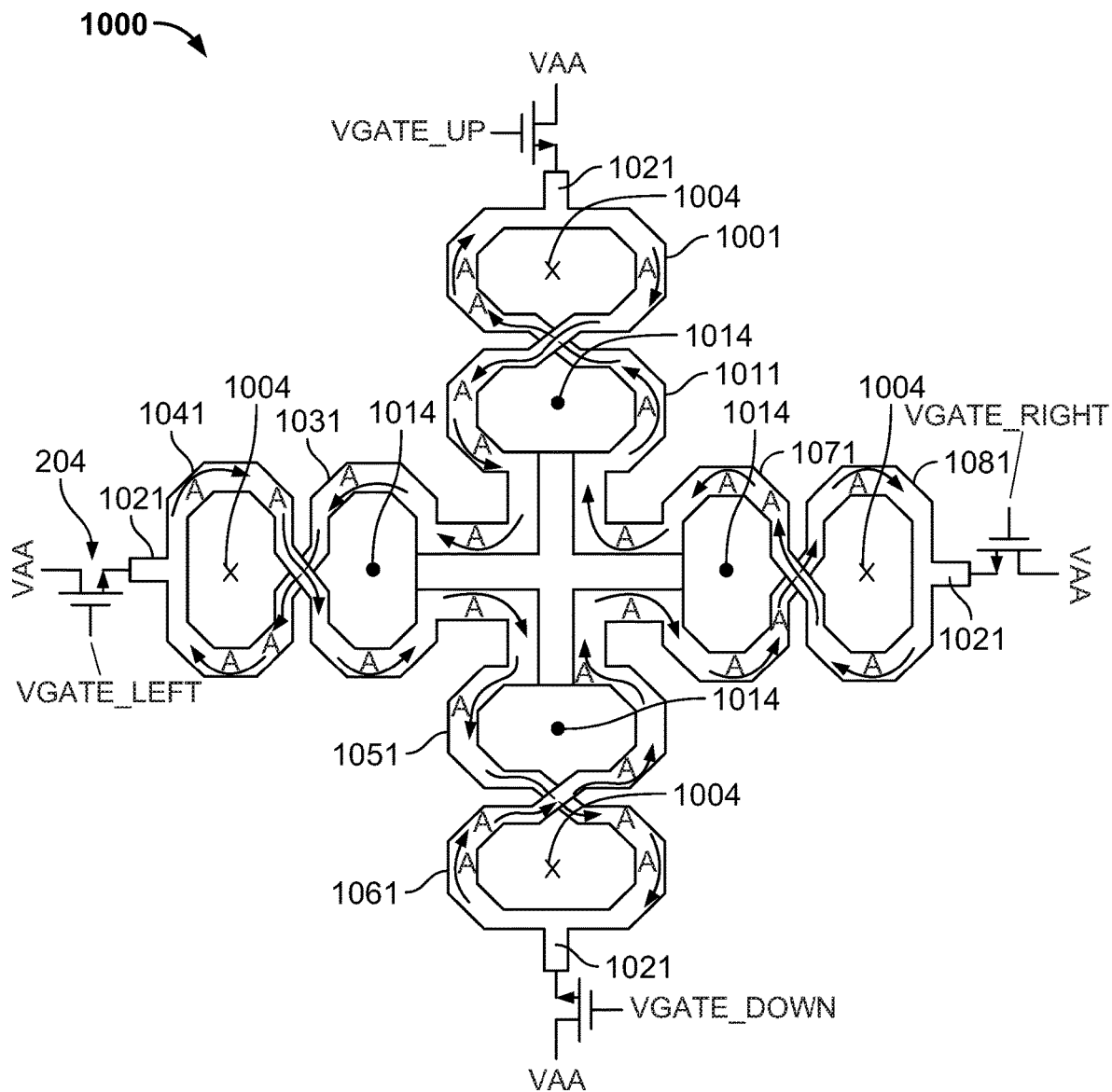
FIG. 10 shows a sixth layout of an L-C oscillator in accordance with implementations of the subject matter of this disclosure.

Oscillator layout 1000 of FIG. 10 is similar to layout 800, in that inductors 1001, 1011, 1031, 1041, 1051, 1061, 1071, 1081 are arranged along two orthogonal axes, and is similar to layout 900 in that, for each axis, two inductors —1001, 1011 and 1031, 1041, and 1051, 1061, and 1071, 1081—are located on either side of central transconductance and capacitance region 1003.

Inductors 1001, 1011, 1031, 1041, 1051, 1061, 1071, 1081 are coupled in a "quad figure-8" layout in which current may flow as indicated by the arrows A. Therefore, following the right-hand rule, magnetic flux in inductors 1001, 1041, 1061, 1081 will flow into the plane of FIG. 10 as indicated by a respective "X" 1004, while magnetic flux in inductors 1011, 1031, 1051, 1071 will flow out of the plane of FIG. 10 as indicated by a respective dot 1014 (current also may flow in the direction opposite arrows A, in which case the direction of each of the flux vectors 1004, 1014 will be reversed). If all inductors 1001, 1011, 1031, 1041, 1051, 1061, 1071, 1081 have the same inductance, the four pairs of flux vectors 1004, 1014 will cancel out outside of oscillator 1000, mitigating the injection pulling effect of oscillator 1000 as an aggressor.

For oscillator 1000 as a victim of injection pulling, because of the dense arrangement of inductors 1001, 1011, 1031, 1041, 1051, 1061, 1071, 1081 along two orthogonal axes, the victim effects may be mitigated with respect to aggressors in most locations, because any aggressor would be at substantially balanced distances from the four flux vectors 1004 and the four flux vectors 1014.

Figure 11:
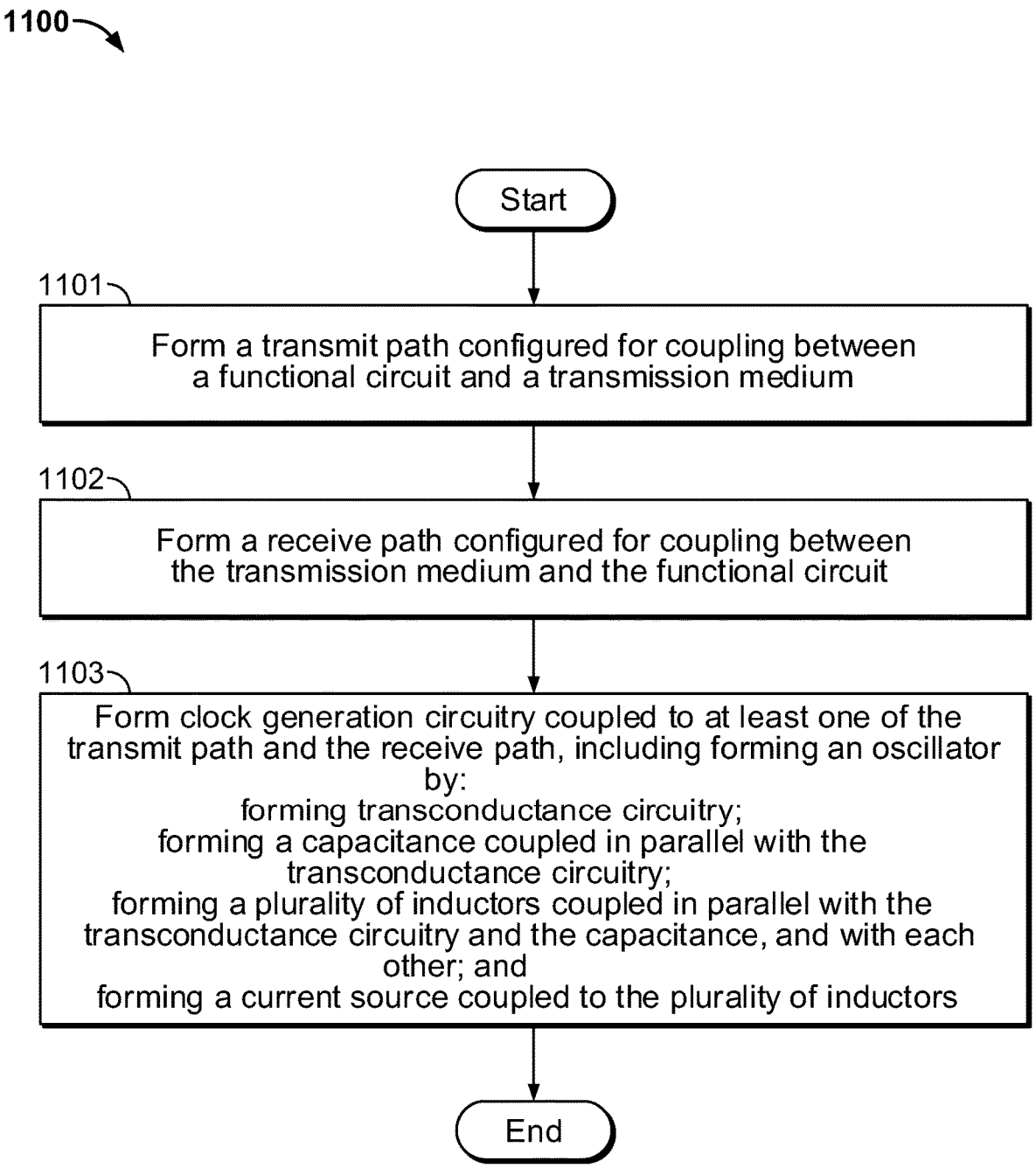
FIG. 11 is a flow diagram illustrating a method in accordance with implementations of the subject matter of this disclosure.

A method 1100 according to implementations of the subject matter of this disclosure for fabricating integrated circuit transceiver circuitry as described in FIGS. 1-10 is diagrammed in FIG. 11. Method 1100 begins at 1101, where a transmit path configured for coupling between a functional circuit and a transmission medium is formed. At 1102, a receive path configured for coupling between the transmission medium and the functional circuit is formed. At 1103, clock generation circuitry coupled to at least one of the transmit path and the receive path is formed, including forming an oscillator by (1) forming transconductance circuitry, (2) forming a capacitance element coupled in parallel with the transconductance circuitry, (3) forming a plurality of inductors coupled in parallel with the transconductance circuitry and the capacitance element, and with each other; and (4) forming a current source coupled to the plurality of inductors. Method 1100 then ends.

Thus it is seen that an oscillator for an integrated circuit serializer-deserializer, having an improved quality factor and reduced injection pulling, and a method of fabricating such an oscillator, have been provided. As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. Transceiver circuitry configured to couple a functional circuit to a transmission medium, the transceiver circuitry comprising:
   a transmit path configured for coupling between the functional circuit and the transmission medium;
   a receive path configured for coupling between the transmission medium and the functional circuit; and
   clock generation circuitry coupled to at least one of the transmit path and the receive path, the clock generation circuitry including an oscillator comprising:
   transconductance circuitry,
   a capacitance element coupled in parallel with the transconductance circuitry,
   a plurality of inductors coupled in parallel with the transconductance circuitry and the capacitance element, and with each other, the plurality of inductors being arranged to mitigate injection pulling between the oscillator and a neighboring oscillator, and a current source coupled to the plurality of inductors.

2. The transceiver circuitry of claim 1 wherein the capacitance element is variable, for tuning a frequency of the oscillator.

3. The transceiver circuitry of claim 2 wherein the variable capacitance element comprises a variable capacitor.

4. The transceiver circuitry of claim 3 wherein the variable capacitor comprises a varactor, whose capacitance is a function of the voltage applied across the varactor.

5. The transceiver circuitry of claim 2 wherein:

the variable capacitance element comprises a plurality of capacitors; and each capacitor in the plurality of capacitors is switchably coupled in parallel with each other capacitor in the plurality of capacitors.

6. The transceiver circuitry of claim 1 wherein the current source comprises a transistor in a source-follower configuration.

7. The transceiver circuitry of claim 1 wherein the current source comprises a plurality of current sources, each respective current source in the plurality of current sources being coupled to a respective inductor in the plurality of inductors.

8. The transceiver circuitry of claim 7 wherein each respective current source is separately controllable.

9. The transceiver circuitry of claim 1 wherein the plurality of inductors comprises an even number of inductors arranged so that a first half of the even number of inductors generates a first magnetic flux in a first direction, and a second half of the even number of inductors generates a second magnetic flux in a second direction opposite to the first direction.

10. The transceiver circuitry of claim 9 wherein the inductors in the plurality of inductors are arranged along a single axis.

11. The transceiver circuitry of claim 9 wherein the inductors in the plurality of inductors are arranged along multiple axes.

12. The transceiver circuitry of claim 1 wherein each inductor in the plurality of inductors comprises a single loop.

13. The transceiver circuitry of claim 1 wherein each inductor in the plurality of inductors is a spiral inductor comprising a plurality of loops.

14. A method of fabricating integrated circuit transceiver circuitry configured to couple a functional circuit to a transmission medium, the method comprising:

forming a transmit path configured for coupling between the functional circuit and the transmission medium;

forming a receive path configured for coupling between the transmission medium and the functional circuit; and forming clock generation circuitry coupled to at least one of the transmit path and the receive path, wherein forming the clock generation circuitry comprises forming an oscillator by:

forming transconductance circuitry, forming a capacitance coupled in parallel with the transconductance circuitry, forming a plurality of inductors coupled in parallel with the transconductance circuitry and the capacitance, and with each other, and arranging the plurality of inductors to mitigate injection pulling between the oscillator and a neighboring oscillator, and forming a current source coupled to the plurality of inductors.

15. The method of fabricating integrated circuit transceiver circuitry according to claim 14 wherein forming the capacitance comprises forming a variable capacitance, for tuning a frequency of the oscillator.

16. The method of fabricating integrated circuit transceiver circuitry according to claim 15 wherein forming the variable capacitance comprises forming a variable capacitor.

17. The method of fabricating integrated circuit transceiver circuitry according to claim 16 wherein forming the variable capacitor comprises forming a varactor, whose capacitance is a function of the voltage applied across the varactor.

18. The method of fabricating integrated circuit transceiver circuitry according to claim 15 wherein:

forming the variable capacitance comprises forming a plurality of capacitors, each capacitor in the plurality of capacitors being switchably coupled in parallel with each other capacitor in the plurality of capacitors.

19. The method of fabricating integrated circuit transceiver circuitry according to claim 14 wherein forming the current source comprises forming a transistor in a source-follower configuration.

20. The method of fabricating integrated circuit transceiver circuitry according to claim 14 wherein forming the current source comprises forming a plurality of current sources, each respective current source in the plurality of current sources being coupled to a respective inductor in the plurality of inductors.

21. The method of fabricating integrated circuit transceiver circuitry according to claim 20 wherein forming the plurality of current sources comprises forming each respective current source to be separately controllable.

22. The method of fabricating integrated circuit transceiver circuitry according to claim 14 wherein arranging the plurality of inductors comprises forming an even number of inductors arranged so that a first half of the even number of inductors generates a first magnetic flux in a first direction, and a second half of the even number of inductors generates a second magnetic flux in a second direction opposite to the first direction.

23. The method of fabricating integrated circuit transceiver circuitry according to claim 22 comprising arranging the inductors in the plurality of inductors along a single axis.

24. The method of fabricating integrated circuit transceiver circuitry according to claim 22 comprising arranging the inductors in the plurality of inductors along multiple axes.

* * * * *